United States Patent
Inamoto et al.

(10) Patent No.: US 8,449,712 B2
(45) Date of Patent: May 28, 2013

(54) ELECTRODE BONDING METHOD AND PART MOUNTING APPARATUS

(75) Inventors: Yoshimasa Inamoto, Kyoto (JP); Hachiro Nakatsuji, Saga (JP); Kazuhiro Inoue, Osaka (JP); Hiroyuki Tsuji, Kyoto (JP)

(73) Assignee: Panasonic Corporation, Osaka (JP)

( * ) Notice: Subject to any disclaimer, the term of this patent is extended or adjusted under 35 U.S.C. 154(b) by 510 days.

(21) Appl. No.: 12/300,546

(22) PCT Filed: Jun. 22, 2007

(86) PCT No.: PCT/JP2007/063063
§ 371 (c)(1), (2), (4) Date: Nov. 12, 2008

(87) PCT Pub. No.: WO2007/148836
PCT Pub. Date: Dec. 27, 2007

(65) Prior Publication Data
US 2009/0145546 A1 Jun. 11, 2009

(30) Foreign Application Priority Data
Jun. 22, 2006 (JP) .................. 2006-172230

(51) Int. Cl.
*H05H 1/24* (2006.01)
*B23K 35/38* (2006.01)
*B23K 20/10* (2006.01)
*B23K 11/0006* (2006.01)
*B23K 35/383* (2006.01)
*B23K 11/00* (2006.01)

(52) U.S. Cl.
CPC *H05H 1/24* (2013.01); *B23K 20/10* (2013.01); *B23K 11/0006* (2013.01); *B23K 35/38* (2013.01); *B23K 35/383* (2013.01)

USPC .................. 156/272.6; 156/272.2; 228/110.1; 228/203; 228/205; 228/206; 228/262

(58) Field of Classification Search
USPC .................. 156/272.6, 272.2; 228/110.1, 203, 228/205, 206, 262
See application file for complete search history.

(56) References Cited

U.S. PATENT DOCUMENTS
6,693,043 B1 * 2/2004 Li et al. .......................... 438/725
2001/0037997 A1 * 11/2001 Barnett .................... 219/121.48
(Continued)

FOREIGN PATENT DOCUMENTS
EP 1484793 A 12/2004
JP 4-212253 8/1992
(Continued)

OTHER PUBLICATIONS
English language Abstract of JP 2004-228346 A.
(Continued)

*Primary Examiner* — Richard Crispino
*Assistant Examiner* — Elizabeth Royston
(74) *Attorney, Agent, or Firm* — Greenblum & Bernstein, P.L.C.

(57) ABSTRACT

An electrode bonding method according to the present invention includes: a plasma cleaning step of irradiating an electrode surface to be cleaned of at least either one of a part, such as a semiconductor device, and a substrate with atmospheric pressure plasma for cleaning; an inert gas atmosphere maintaining step of covering the electrode surface to be cleaned and its vicinity with a first inert gas before the irradiation of the atmospheric pressure plasma is ended, and maintaining that state even thereafter; and a bonding step of bonding an electrode of the part and an electrode on the substrate before the inert gas atmosphere maintaining step is ended. The electrode surface is thereby plasma-cleaned without the possibility of damaging the part to be bonded to the substrate, and the cleaned state is maintained while bonding the electrodes to provide an electrode bonding state of high bonding force and high reliability.

4 Claims, 9 Drawing Sheets

U.S. PATENT DOCUMENTS

| | | |
|---|---|---|
| 2002/0148816 A1 | 10/2002 | Jung et al. |
| 2004/0050685 A1* | 3/2004 | Yara et al. .................... 204/164 |
| 2005/0082669 A1 | 4/2005 | Saijo et al. |
| 2006/0054283 A1 | 3/2006 | Yamauchi |
| 2007/0068623 A1* | 3/2007 | Kim et al. .................. 156/345.3 |

FOREIGN PATENT DOCUMENTS

| | | |
|---|---|---|
| JP | 4-358076 | 12/1992 |
| JP | 9-167757 | 6/1997 |
| JP | 2002-110613 | 4/2002 |
| JP | 2004-223600 A | 8/2004 |
| JP | 2004-228346 A | 8/2004 |
| JP | 2006-013479 | 1/2006 |
| JP | 2006-086311 | 3/2006 |
| JP | 2006-134899 | 5/2006 |
| JP | 2006-134900 | 5/2006 |

OTHER PUBLICATIONS

English language Abstract of JP 2004-223600 A.

Parry S: "Plasma Leaves Soldering Out in the Cold," Electronics World, Nexus Media Communications, Swanley, Kent, GB, vol. 100, No. 1694, Jan. 1994, p. 6, XP000424160.

* cited by examiner

ELECTRODE BONDING METHOD AND PART MOUNTING APPARATUS

TECHNICAL FIELD

The present invention relates to an electrode bonding method for bonding electrodes of a part to electrodes on a substrate, and a part mounting apparatus to which the method is applied, and in particular, to an electrode bonding method and a part mounting apparatus for plasma-cleaning electrode surfaces and maintaining the state while bonding the electrodes to provide a bonding state of high reliability.

BACKGROUND ART

Electrode bonding methods for loading various types of parts, such as a semiconductor device having bump electrodes or flat electrodes and a part having a flexible substrate equipped with bump electrodes or flat electrodes, on substrates that have flat electrodes or bump electrodes, and bonding those electrodes to each other by ultrasonic bonding or thermocompression bonding have heretofore been known. If the ultrasonic bonding or thermocompression bonding is performed with oxide films on the electrode surfaces or in the presence of organic stains and absorbed moisture, the bonding surfaces can involve those to cause a lack of bonding force. Thus, it has also been known that the surfaces of the electrodes of the parts and substrates are wet-cleaned for acid treatment or cleaned by plasma processing in a vacuum processing chamber, thereby removing oxide films from the electrode surfaces or removing organic stains to provide a bonding state of high bonding force and reliability.

Cleaning apparatuses for performing the cleaning typically require large-scale devices and cost high, however, and the cleaning apparatuses are installed away from mounting apparatuses which load and bond the parts onto the substrates. There has thus been the problem that while the substrates and parts are transported therebetween, oxide films, organic stains, and moisture absorption can occur again from moisture, oxygen, carbon dioxide, and the like in the air with a drop in bonding force.

Then, as a bonding method for solving this problem, there has been known a bonding method which comprises the steps, such as shown in FIGS. 10A to 10C, of: putting a bonding article (electronic part) 61 and a to-be-bonded article (substrate) 62 close to each other with their flat surfaces maintained generally in parallel, supplying inert gas 64 from a gas nozzle 63 to therebetween so that the gap is filled with the inert gas, and applying electric power from a power supply 65 to between the bonding article 61 and the to-be-bonded article 62 to generate plasma 66 (FIG. 10A); then stopping the supply of power to extinguish the plasma 66 (FIG. 10B); and then putting the bonding article 61 into contact with the to-be-bonded article 62 for bonding (FIG. 10C) (See Japanese Patent Laid-Open Publication No. 2004-223600).

As shown in FIG. 11, there has also been known a method which comprises: supplying a mixed gas of an inert gas and a reactive gas from a gas source 71 through flow rate adjusting means 72 to atmospheric pressure plasma generating means 73; applying a high frequency electric field to the mixed gas in the atmospheric pressure plasma generating means 73 to generate atmospheric pressure plasma 74; and spraying the generated atmospheric pressure plasma 74 from a plasma nozzle 75 to bonding areas of a bonding article (electronic part) 76 and a to-be-bonded article (substrate) 77 to clean the surfaces of the bonding areas with the plasma while bringing the clean bonding areas of the bonding article 76 and the to-be-bonded article 77 into contact with each other in a bonding apparatus 78 to bond the bonding article 76 and the to-be-bonded article 77 (See Japanese Patent Laid-Open Publication No. 2004-228346).

By the way, in the bonding method shown in FIGS. 10A to 10C, electric power is supplied from the power supply 65 to between the bonding article 61 and the to-be-bonded article 62 to generate the plasma 66 therebetween, and it follows that the highly-charged plasma 66 lies between the bonding article 61 and the to-be-bonded article 62. This leads to the problem that if the bonding article 61 is a semiconductor device with electrodes, there is the possibility of damaging the bonding article 61 itself by charging up or the like, with a drop in the quality level of the bonding article 61 itself.

Moreover, in the configuration shown in FIG. 11, the atmospheric pressure plasma 74 generated by the atmospheric pressure plasma generating means 73 has only a short life and attenuates sharply once outside the atmospheric pressure plasma generating means 73. This requires a short distance between the atmospheric pressure plasma generating means 73 and the plasma nozzle 75. In actual apparatuses, it is difficult to practice such a mode as shown in FIG. 11 because of layout spaces of the individual instruments. There is also the problem that the atmospheric pressure plasma 74 coming into the air from the plasma nozzle 75 collides with moisture and oxygen contained in the air and disappears, and it is known that the effective irradiation range of the atmospheric pressure plasma 74 from the plasma nozzle 75 is within 3 mm from the extremity of the plasma nozzle 75. In the meantime, as shown in FIG. 12, the area where electrodes 76a of a bonding article (electronic part) 76 and electrodes 77a of a to-be-bonded article (substrate) 77 are formed ranges several millimeters if the bonding article (electronic part) 76 is small, and several tens of millimeters if the bonding article (electronic part) 76 is large. In such circumstances, there is a problem since in many cases the surfaces of the electrodes 76a to be irradiated with the atmospheric pressure plasma 74 fail to be irradiated as in area A, and the surfaces of the electrodes 76a to be irradiated can no longer benefit from the plasma effect even if irradiated successfully as in area B.

The present invention has been devised to solve the foregoing conventional problems, and it is an object thereof to provide an electrode bonding method which has no possibility of damaging a part to be bonded to a substrate, is capable of plasma-cleaning electrode surfaces even if the part has a large electrode layout area, and is further capable of maintaining the cleaned state while bonding the electrodes to provide a bonding state of high bonding force and high reliability.

Another object is to provide a part mounting apparatus to which the foregoing electrode bonding method is applied to provide a bonding state of high bonding force and high reliability.

DISCLOSURE OF THE INVENTION

An electrode bonding method according to the present invention comprises: a plasma cleaning step of irradiating an electrode surface to be cleaned of at least either one of a part and a substrate with atmospheric pressure plasma for cleaning; an inert gas atmosphere maintaining step of covering the electrode surface to be cleaned and its vicinity with a first inert gas before the irradiation of the atmospheric pressure plasma is ended, and maintaining that state even thereafter; and a bonding step of bonding an electrode of the part and an electrode on the substrate before the inert gas atmosphere maintaining step is ended. It should be noted that while nitrogen gas is not literally an inert gas, it can be used almost the same as actual inert gas is in the present invention. As employed herein, nitrogen gas shall therefore be included in the inert gas.

According to the foregoing configuration, the electrode surface to be cleaned is irradiated with the atmospheric pressure plasma, instead of electric power being supplied to between the part and the substrate to generate plasma. It is therefore possible to plasma-clean the electrode surface without the possibility that the electrode of the part to be bonded to the substrate may be charged up and damaged with an electric charge. Since the electrode surface cleaned is covered with the first inert gas, it is also possible to maintain the cleaned state. The electrodes are bonded subsequently while maintaining the cleaned state, and can thus provide a bonding state of high bonding force and high reliability.

In the plasma cleaning step, it is preferable to remove ion charges from the plasma by using a ground electrode arranged near the irradiating atmospheric pressure plasma, so that the irradiation primarily involves radicals alone. This further reduces the possibility that the electrode of the part may be charged up and damaged with an electric charge.

In the plasma cleaning step, the electrode surface to be cleaned and its vicinity are preferably covered with the first inert gas before irradiated with the atmospheric pressure plasma, so that the electrode surface to be cleaned is irradiated with radicals in the atmospheric pressure plasma through the medium of the first inert gas. Then, since radicals have longer life in the first inert gas and the first inert gas develops the radicals over the entire electrode surface to be cleaned for irradiation, all the electrode surface are plasma-cleaned with reliability even if electrodes to be cleaned have a large layout area.

In the inert gas atmosphere maintaining step, it is preferable to supply the first inert gas so as to flow along the electrode surface to be cleaned, and suck the first inert gas after it has flown along the electrode surface to be cleaned. This makes it possible to cover the entire electrode surface to be cleaned with the first inert gas without fail, and maintain the cleaned state with reliability. Besides, if the first inert gas is thus supplied from before the irradiation of the atmospheric pressure plasma as described above, it is possible to plasma-clean all the electrode surface with higher reliability.

The plasma cleaning step may use atmospheric pressure plasma generated by applying a high frequency electric field to a mixed gas of a second inert gas and a reactive gas near atmospheric pressures. This atmospheric pressure plasma can be generated with an atmospheric pressure plasma generating apparatus of simple and compact configuration.

The plasma cleaning step also suitably uses plasma that is generated by making a reactive gas or a mixed gas of a third inert gas and a reactive gas collide with atmospheric pressure plasma generated by applying a high frequency electric field to the second inert gas. This generates atmospheric pressure plasma with reliability and stability at low power, and make the reactive gas or the mixed gas collide with the atmospheric pressure plasma to generate radicals of the reactive gas efficiently in large amounts for irradiation. A large area of wide electrode surface to be cleaned is thus cleaned with low power.

The first, second, and third inert gases suitably use a mutually identical or different types of gases selected from among argon, helium, xenon, neon, nitrogen, and mixed gases of one or a plurality of types of these. The reactive gas can remove oxide films if it is hydrogen gas, and can decompose and remove organics if oxygen gas.

In the bonding step, ultrasonic vibrations are suitably applied to between the electrodes for bonding if the electrode surface on the substrate is gold and the electrode of the part is a gold bump.

In the bonding step, the electrodes are suitably bonded by thermocompression if at least either one of the electrode on the substrate and the electrode of the part is made of a solder material.

Furthermore, in the bonding step, an isotropic conductive or nonconductive film may be attached to or an isotropic conductive or nonconductive paste may be applied to at least either one of the electrode on the substrate and the electrode of the part before bonding. This enhances the bonding force easily without fail.

A part mounting apparatus according to the present invention is a part mounting apparatus for loading a part on a substrate and bonding an electrode of the substrate and an electrode of the part, the apparatus including: substrate positioning means for positioning the substrate to a predetermined position; a part supply unit for supplying the part; part loading means for picking up the part in the part supply unit, transferring it, loading it on the substrate, and boding an electrode of the substrate and an electrode of the part; atmospheric pressure plasma irradiating means for irradiating the electrode of at least either one of the substrate and the part with atmospheric pressure plasma; inert gas supply means for supplying a first inert gas so that a surface of the electrode to be irradiated with the atmospheric pressure plasma is covered with the first inert gas; and a control unit for controlling the substrate positioning means, the part supply unit, the part loading means, the atmospheric pressure plasma irradiating means, and the inert gas supply means. The control unit exercises control so as to activate the inert gas supply means before the irradiation of the surface of the electrode with the atmospheric pressure plasma is ended, and maintain the electrode surface irradiated with the atmospheric pressure plasma as covered with the first inert gas while bonding the electrodes of the substrate and the part.

According to the foregoing configuration, it is possible to practice the foregoing electrode bonding method and mount the part on the substrate so that the electrode of the part and the electrode of the substrate are stably bonded with high bonding force.

It is preferable that a discharge port and a suction port of the first inert gas be arranged so that the first inert gas flows along the electrode surface to be irradiated with the atmospheric pressure plasma. This makes it possible to cover the entire electrode surface with the first inert gas without fail, and maintain the clean state with reliability.

The inert gas supply means preferably supplies nitrogen gas of 99% or higher in purity, obtained directly from the air through a nitrogen generator of PSA (Pressure Swing Adsorption) type or membrane separation type, as the first inert gas. This makes it possible to create the first inert gas atmosphere, requiring no inert gas of extremely high purity, with a low-cost configuration.

As for the arrangement and configuration of the individual means, it is preferable that the inert gas supply means be arranged on the part loading means, and the atmospheric pressure plasma irradiating means be arranged near the part supply unit or the substrate positioning means within the movable range of the part loading means. This makes it possible to plasma-clean the electrode of the part picked up by the part loading means while transferring the part with the part loading means, and create an inert gas atmosphere to maintain the clean state. In that state, the part loading means can bond the electrodes of the part and the substrate to mount the part on the substrate.

In another configuration, the inert gas supply means may be arranged on the substrate positioning means, and the atmospheric pressure plasma irradiating means is arranged on the part loading means. This makes it possible to plasma-clean the electrode of the substrate as opposed to the part loading means, and supply the inert gas from the inert gas supply means to create an inert gas atmosphere, thereby maintaining the clean state of the electrode of the substrate. It should be appreciated that this may be combined with the foregoing cleaning of the electrode of the part so that the electrodes of both the part and the substrate are cleaned for mounting.

Furthermore, if first recognition means for detecting the amount of displacement of the electrode on the part picked up with respect to a reference position is arranged within the movable range of the part loading means, and second recognition means for detecting the amount of displacement of the electrode on the substrate with respect to a reference position is arranged on the part loading means, it is possible to position the electrode of the part and the electrode of the substrate with high precision to ensure a bonding state of high reliability.

BEST MODE FOR CARRYING OUT THE INVENTION

Figure 1A:
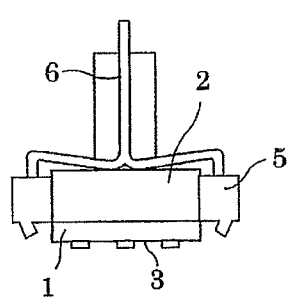
FIGS. 1A to 1D are process explanatory diagrams of embodiment 1 according to the electrode bonding method of the present invention.

Hereinafter, a description will be given of embodiments of the electrode bonding method according to the present invention and a part mounting apparatus to which the method is applied.

Embodiment 1

Initially, embodiment 1 according to the electrode bonding method of the present invention will be described with reference to FIGS. 1A to 4F.

FIGS. 1A to 1D show the basic steps of the electrode bonding method according to the present embodiment. Initially, in the step of FIG. 1A, a semiconductor device 1, or a part, is sucked and held on a suction head 2. As shown enlarged in FIG. 2, the suction head 2 is provided with a gas delivery header 5 for discharging a first inert gas 4 toward an electrode layout surface 3 of the held semiconductor device 1, including electrode surfaces to be cleaned. A gas supply pipe 6 in connection with a gas source (not shown) of the first inert gas is connected to this gas delivery header 5. Next, in the step of FIG. 1B, the electrode layout surface 3 is irradiated with atmospheric pressure plasma 8 discharged from atmospheric pressure plasma irradiating means 7 so that the electrode layout surface 3 is cleaned with the atmospheric pressure plasma 8. Before the irradiation of the atmospheric pressure plasma 8 is ended, the first inert gas 4 is discharged from the gas delivery header 5 so that the electrode layout surface 3 and its vicinity are maintained in the inert gas atmosphere. For the gas source, it is preferable to obtain the first inert gas 4 directly from the air through a nitrogen generator of PSA (Pressure Swing Adsorption) type or membrane separation type because it is possible to obtain nitrogen gas of 99% or higher in purity at low cost, and the first inert gas 4 is sufficiently effective with the purity of that order.

In this instance, the principle of cleaning using atmospheric pressure plasma will be described. In the vicinity of atmospheric pressures (in the range of 500 to 1500 mmHg in pressure), when inert gas is supplied to a reaction space along with the application of a high frequency electric field, inert gas atoms in the reaction space are excited or ionized into radicals, ions, and electrons by electrons in the discharge plasma. Radicals are atoms in a metastable state of high energy, and have the property of reacting with the same or different types of atoms lying around to excite or ionize those atoms, thereby returning to a stable state. Electrons also collide with the same or different types of atoms successively to generate radicals, ions, and electrons, whereby the reaction of generating radicals proceeds in a snowball fashion. Here, if there is a reactive gas such as hydrogen gas and oxygen gas, inert gas radicals also excite or ionize reactive gas atoms around to generate reactive gas radicals, ions, and electrons. When this atmospheric pressure plasma, including reactive gas radicals, is discharged from the reaction space to irradiate the surface of an object to be treated with, the reactive gas radicals react with the materials of the surface of the object to be treated and perform cleaning by plasma processing such as reducing and eliminating surface oxides, and decomposing and removing surface organics.

Figure 1B:
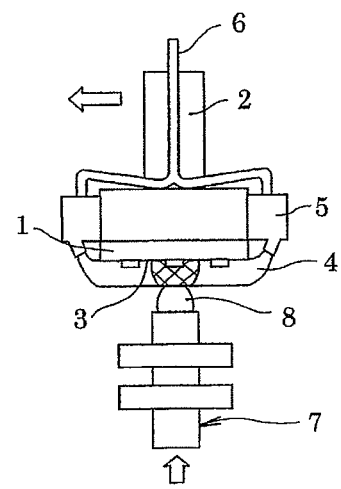

In the foregoing step of FIG. 1B, the atmospheric pressure plasma 8 discharged from the atmospheric pressure plasma irradiating means 7 will immediately disappear if in the air. In the shown example, however, the gas delivery header 5 discharges the first inert gas 4 and the first inert gas 4 covers the electrode layout surface 3 and its vicinity, in which state the atmospheric pressure plasma 8 is discharged toward the electrode layout surface 3. The presence of the first inert gas 4 prevents radicals in the atmospheric pressure plasma 8 from disappearing, and the electrode layout surface 3 is irradiated with reliability. Moreover, the suction head 2 can be moved along the atmospheric pressure plasma irradiating means 7 below as shown by the arrow so that the entire electrode layout surface 3 is effectively irradiated with the atmospheric pressure plasma 8 having reactive gas radicals in succession. In this way, the entire electrode layout surface 3 is cleaned with the atmospheric pressure plasma 8.

Figure 1C:
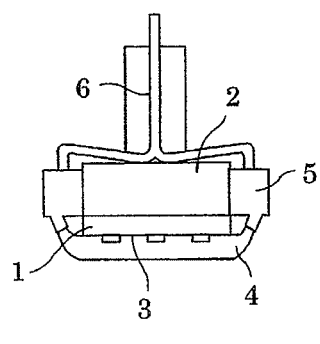

Next, in the step of FIG. 1C, even after the electrode layout surface 3 is cleaned with the atmospheric pressure plasma 8 as described above, the first inert gas 4 continues being discharged from the gas delivery header 5 so that the electrode layout surface 3 and its vicinity are maintained in the inert gas atmosphere. In this state, the suction head 2 is moved toward a position where the semiconductor device 1 is loaded onto a substrate 10. Next, in the step of FIG. 1D, the semiconductor device 1 is positioned to immediately above the semiconductor device loading position of the substrate 10 which is held on a semiconductor holding table 9 serving as substrate positioning means. The suction head 2 and the substrate holding table 9 are then put close to each other so that electrodes of the substrate 10 and electrodes of the semiconductor device 1 come into contact. Subsequently, those electrodes are bonded to each other by ultrasonic bonding or thermocompression bonding. The inert gas atmosphere created by the first inert gas 4 is maintained until the bonding step is ended, and the first inert gas 4 stops being discharged when the bonding is completed.

Figure 2:
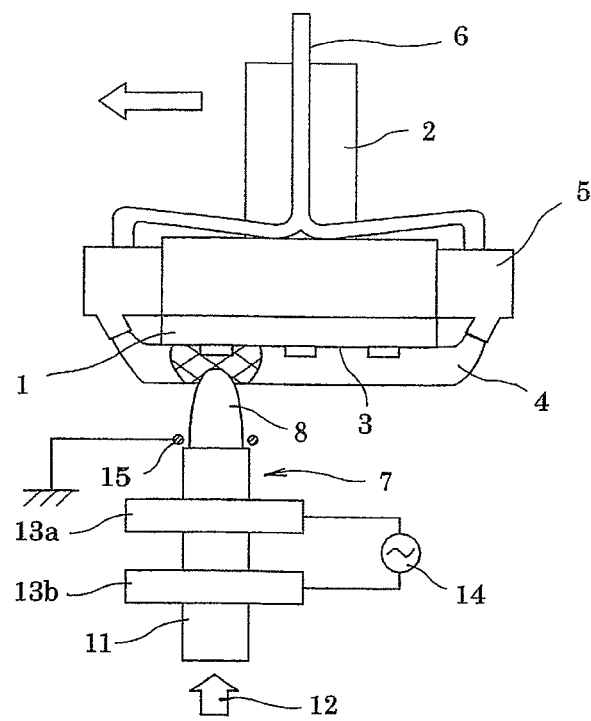
FIG. 2 is an enlarged configuration diagram showing a suction head, a gas delivery header, and atmospheric pressure plasma irradiating means according to embodiment 1.
Figure 3:
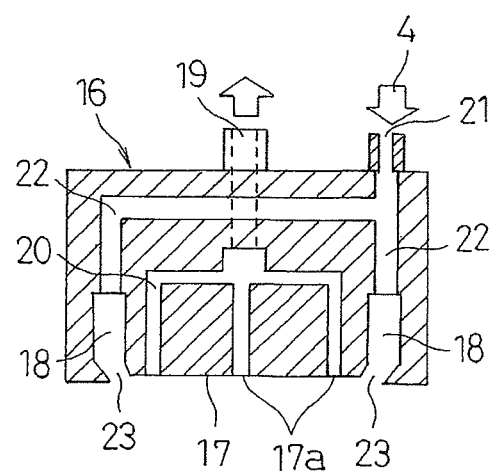
FIGS. 3A and 3B show an example of configuration of the suction head in which the gas delivery header according to embodiment 1 is built integrally, FIG. 3A being a longitudinal sectional view, FIG. 3B being a perspective view as seen from below.
Figure 3:
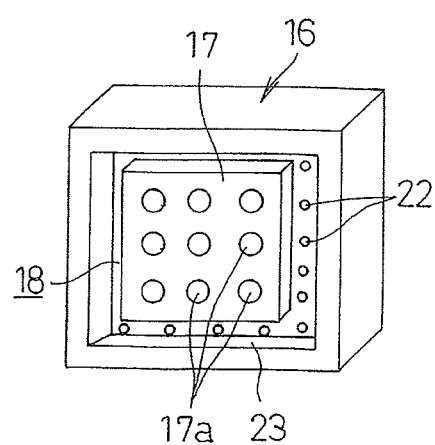
Figure 4:
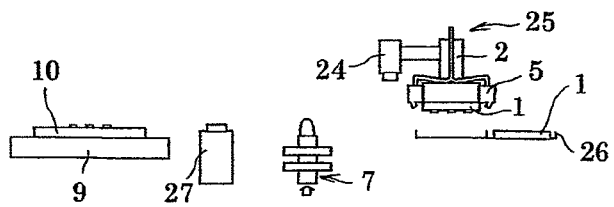
FIGS. 4A to 4F are process explanatory diagrams of a part mounting method to which the electrode bonding method of embodiment 1 is applied.
Figure 4:
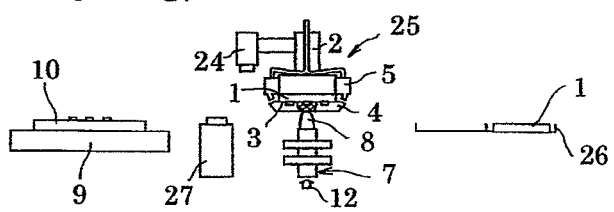
Figure 4:
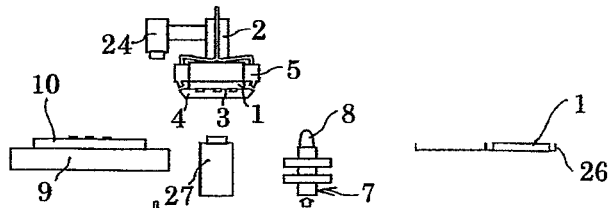
Figure 4:
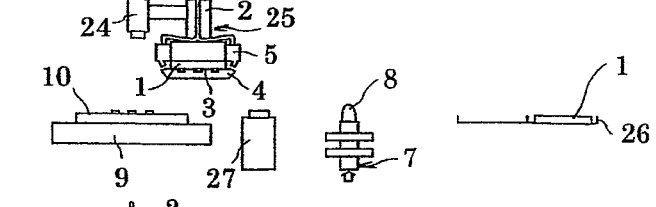
Figure 4:
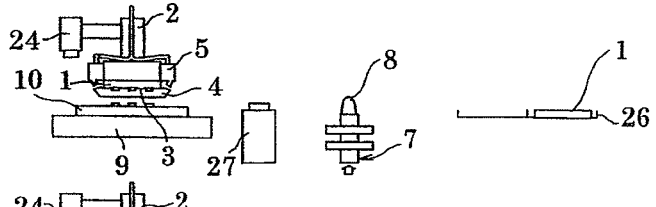
Figure 4:
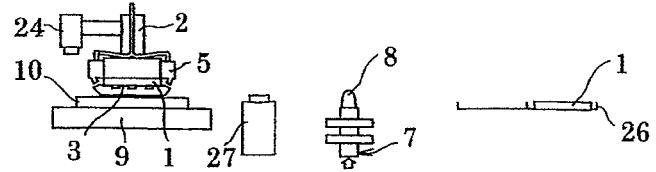
Figure 5:
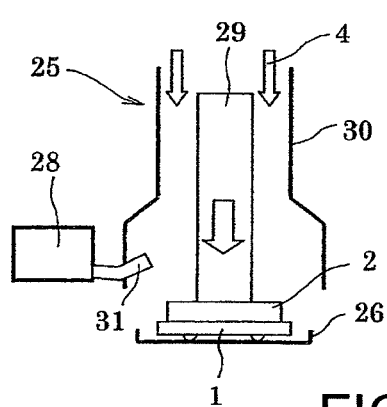
FIGS. 5A to 5D are process explanatory diagrams of embodiment 2 according to the electrode bonding method of the present invention.
Figure 5:
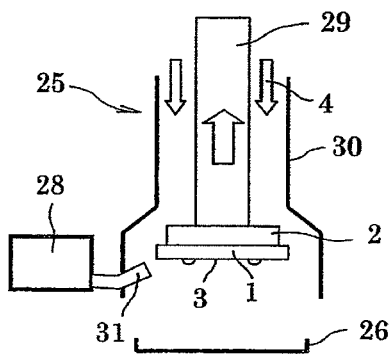
Figure 5:
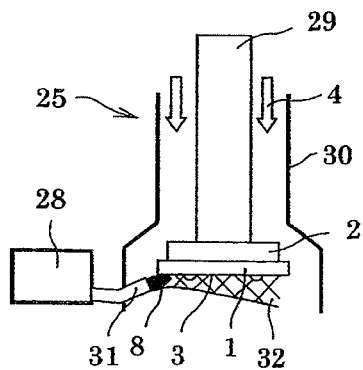
Figure 5:
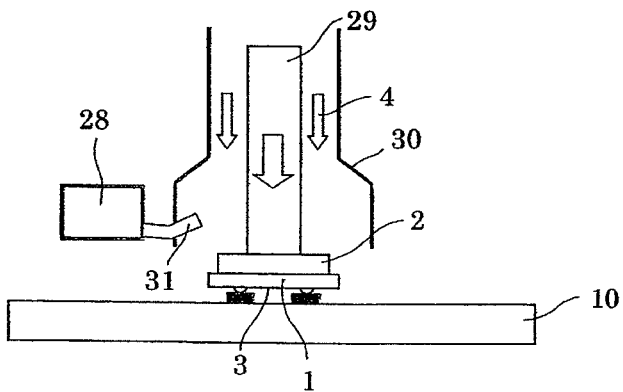

It should be appreciated that, as shown in FIG. 2, the atmospheric pressure plasma irradiating means 7 is configured so that a mixed gas 12 of a second inert gas and a reactive gas is supplied from one end of its cylindrical reaction container 11, and a high frequency voltage is applied from a high frequency power supply 14 to a pair of electrodes 13*a* and 13*b* arranged around the periphery of the reaction container 11 to generate a high frequency electric field. The atmospheric pressure plasma 8 is thereby generated in the reaction container 11 and discharged from the other end of the reaction container 11. The high frequency voltage to be applied is of sinusoidal form, pulsed form, or the like. It should be appreciated that the configuration may include a coil or antenna arranged on the periphery of the reaction container 11 instead of the pair of electrodes 13*a* and 13*b*. Otherwise, the configuration may include a pair of flat electrodes opposed and arranged on opposite sides. It is also preferable that a ground electrode 15 connected to the ground be arranged near the opening in the other end of the reaction container 11 from which the atmospheric pressure plasma 8 is discharged, thereby eliminating ions in the discharging atmospheric pressure plasma 8 so that the electrode layout surface 3 of the semiconductor device 1 is irradiated mainly with radicals alone. This can preclude, with even higher reliability, the possibility that the electrodes of the semiconductor device 1 might be charged up and damaged with electric charges.

For a concrete example of configuration of the foregoing suction head 2 and gas delivery header 5, the suction head 2 is preferably integrated with the gas delivery header 5 as shown in FIGS. 3A and 3B. The suction head 2 is composed of a suction head block 16 which has a suction surface 17 for sucking the semiconductor device 1 in the center of its bottom and a four-side surrounding, equal distribution chamber 18 for distributing the first inert gas equally to four surrounding sides. A plurality of suction holes 17*a* formed in the suction surface 17 are connected to a suction port 19 formed in the top through suction channels 20 formed inside. The equal distribution chamber 18 is connected to a gas supply port 21 formed in the top through gas channels 22 formed inside. A bottom delivery opening 23 of the equal distribution chamber 18 is formed obliquely inward so as to deliver gas toward the suction surface 17. The suction port 19 is connected to suction means (not shown), and the gas supply port 21 is connected to a first inert gas source (not shown). In this way, the suction head 2 and the gas delivery header 5 are preferably combined with each other in an integral fashion for the sake of compact configuration.

Figure 1D:
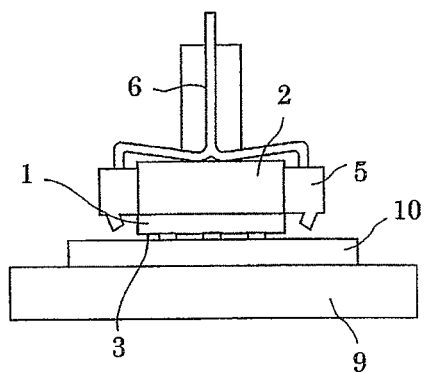

Moreover, when bonding electrodes in the step of FIG. 1D, ultrasonic bonding for applying ultrasonic vibrations to between the electrodes for bonding is preferable if the electrode surfaces on the substrate 10 are plated with gold and the electrodes formed on the semiconductor device 1 are gold bumps. In this instance, heating temperatures of 50° C. to 250° C., ultrasonic frequencies of 20 to 200 kHz, and pressures of 0.1 to 10 MPa are preferable. It should be appreciated that ultrasonic bonding is not limited to the foregoing gold-to-gold bonding, but may also be applied to other materials. In addition to this, when at least either ones of the electrodes on the substrate 10 and the electrodes of the semiconductor device 1 are made of a solder material such as solder balls and solder plating, thermocompression bonding for bonding both the electrodes by thermocompression is preferable. In this instance, heating temperatures of 150° C. to 300° C. are preferable. Furthermore, an anisotropic conductive film or a nonconductive film may be attached to, or an anisotropic conductive or nonconductive paste may be applied to, at least either ones of the electrodes on the substrate 10 and the electrodes of the semiconductor device 1 before bonding. This can enhance the bonding force easily without fail, and can seal the gap between the substrate 10 and the semiconductor device 1 concurrently with bonding.

Next, steps for mounting a semiconductor device on a substrate according to the present embodiment will be described with reference to FIGS. 4A to 4F. Initially, in the step of FIG. 4A, part loading means 25 having the suction head 2, the gas delivery header 5, and second recognition means 24 composed of an image recognition camera or the like for recognizing electrodes on a substrate 10 is moved to a part supply unit 26 to suck and pick up a semiconductor device 1 with the suction head 2. Next, in the step of FIG. 4B, the part loading means 25 is moved to pass over the atmospheric pressure plasma irradiating means 7 to plasma-clean the electrode layout surface 3 of the semiconductor device 1 while the first inert gas 4 is discharged from the gas delivery header 5 so that the electrode layout surface 3 of the semiconductor device 1 and its vicinity are covered with the atmosphere of the first inert gas 4 as described above. Subsequently, the state of being covered with the inert gas atmosphere is maintained to avoid adhesion of organics and moisture to the electrodes and the production of oxide films. Next, in the step of FIG. 4C, the part loading means 25 is positioned so that an electrode or a recognition mark of the semiconductor device 1 comes immediately above first recognition means 27 which is composed of an image recognition camera or the like, thereby recognizing the position of the electrode or recognition mark of the sucked semiconductor device 1 and detecting a deviation from its regular position. Next, in the step of FIG. 4D, the part loading means 25 is positioned so that the second recognition means 24 comes immediately above an electrode or a recognition mark on the substrate 10. The second recognition means 24 recognizes the position of the electrode or recognition mark on the substrate 10, and detects a deviation from its regular position. Next, in the step of FIG. 4E, the amounts of positional deviation recognized are corrected to position the part loading means 25 so that the electrodes of the semiconductor device 1 are located immediately above the electrodes on the substrate 10. In the step of FIG. 4F, the electrodes of the semiconductor device 1 and the electrodes on the substrate 10 are bonded while maintaining the state that the electrode layout surface 3 of the semiconductor device 1 is covered with the inert gas atmosphere. After the bonding is completed, the first inert gas 4 stops being discharged from the gas delivery header 5. This completes the mounting of the semiconductor device 1 on the substrate 10. Subsequently, return to the step of FIG. 4A to repeat the foregoing operations, thereby mounting semiconductor devices 1 on substrates 10 in succession.

Embodiment 2

Next, embodiment 2 according to the electrode bonding method of the present invention will be described with reference to FIGS. 5A to 7. It should be appreciated that in the following description of the embodiment, the same components as those of the preceding embodiment will be designated by identical reference numerals, and a description thereof will be omitted. A description will be mainly given of differences alone.

The foregoing embodiment 1 has dealt with the case where the atmospheric pressure plasma irradiating means 7 is fixed and installed separately from the part loading means 25, and the part loading means 25 is moved to pass over so that the electrode layout surface 3 of the semiconductor device 1 is processed with plasma. In the present embodiment, however, atmospheric pressure plasma irradiating means 28 is arranged on the part loading means 25. More specifically, as shown in FIGS. 5A and 5B, the suction head 2 of the part loading means 25 is supported by vertical movement means 29 so as to be capable of moving up and down, and its vicinity is covered by an open-bottomed cover 30 serving as inert gas supply means, so that the suction head 2 is accommodated in the bottom area of the cover 30 when in the lifted position, and lies protruding down from the bottom of the cover 30 when in the lowered position. The first inert gas 4 is then supplied toward the vicinity of the suction head 2 from above inside this cover 30, and the atmospheric pressure plasma irradiating means 28 is arranged on one side of the bottom area of the cover 30 so that its plasma discharging nozzle 31 pierces through the bottom area of the cover 30 and opens somewhat obliquely upward.

Next, the mounting steps using the foregoing configuration will be described. Initially, in the step of FIG. 5A, the part loading means 25 is moved to the part supply unit 26, and the suction head 2 is lowered by the vertical movement means 29 to suck and hold the semiconductor device 1. Next, in the step of FIG. 5B, the suction head 2 is lifted by the vertical movement means 29 so that the semiconductor device 1 sucked is accommodated in the cover 30. The first inert gas 4 is also supplied into the cover 30 to create an inert gas atmosphere, including the electrode layout surface 3 at the bottom of the semiconductor device 1. It should be appreciated that the first inert gas 4 may be supplied into the cover 30 all the time to create the inert gas atmosphere. Next, in the step of FIG. 5C, the atmospheric pressure plasma irradiating means 28 is activated to discharge the atmospheric pressure plasma 8 from the plasma discharging nozzle 31. It follows that the atmospheric pressure plasma 8 is discharged into the atmosphere of the first inert gas 4. This develops the atmospheric pressure plasma 8 widely into the first inert gas 4, so that the developed plasma 32 spreads along the bottom of the semiconductor device 1 and plasma-cleans the entire electrode layout surface 3 of the semiconductor device 1 without fail. When the plasma cleaning is completed, the operation of the atmospheric pressure plasma irradiating means 28 is stopped while the inert gas atmosphere in the cover 30 is maintained. Next, in the step of FIG. 5D, the part loading means 25 is moved to above the substrate 10 for positioning while maintaining the inert gas atmosphere inside the cover 30. The suction head 2 is then lowered by the vertical movement means 29 to bond the electrodes of the semiconductor device 1 and the electrodes of the substrate 10, thereby mounting the semiconductor device 1 on the substrate 10. In this way, the present embodiment can also provide the same operation and effect as those of the foregoing first embodiment.

Figure 6:
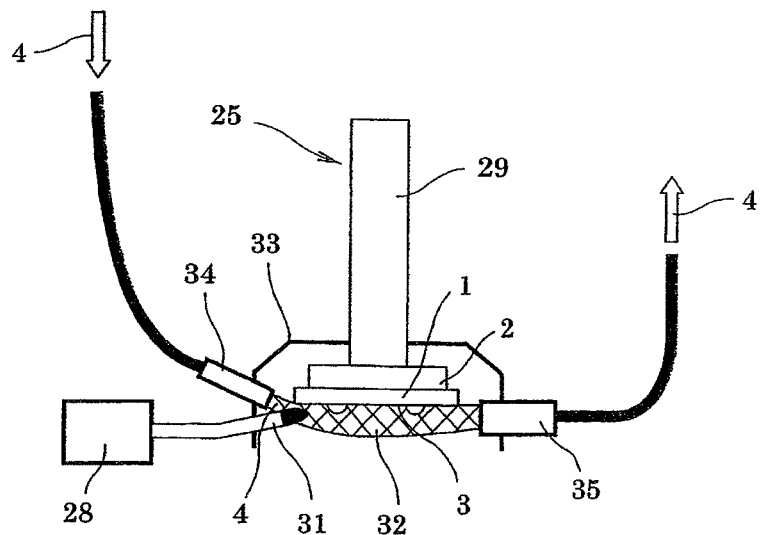
FIG. 6 is a longitudinal sectional view of another configuration example of embodiment 2.

Next, another configuration example of the present embodiment will be described with reference to FIG. 6. The example of FIGS. 5A to 5D has dealt with the case where the first inert gas 4 is supplied into the cover 30 from above so that the entire interior of the cover 30, including the electrode layout surface 3 at the bottom of the semiconductor device 1 which is sucked on the suction head 2, is put in the inert gas atmosphere. In the configuration example of FIG. 6, an open-bottomed cover 33 serving as inert gas supply means, is arranged so as to surround the vicinity of the suction head 2. A discharge port 34 of the first inert gas is formed in one side of this cover 33, and a suction port 35 of the inert gas is formed in the other side, so that the first inert gas 4 discharged from the discharge port 34 flows along the electrode layout surface 3 at the bottom of the semiconductor device 1 sucked on the suction head 2 and is sucked into the suction port 35, thereby maintaining the electrode layout surface 3 in the inert gas atmosphere with the first inert gas 4 flowing. Then, the plasma discharging nozzle 31 of the atmospheric pressure plasma irradiating means 28 is opened near below the discharge port 34 somewhat obliquely upward.

According to this configuration example, the atmospheric pressure plasma 8 discharged collides with the first inert gas 4 discharged from the discharge port 34, and radicals of the atmospheric pressure plasma 8 are carried by the first inert gas 4 flowing along the electrode layout surface 3. This develops plasma 32 all over the electrode layout surface 3, thereby performing effective plasma cleaning on the entire electrode layout surface 3.

Next, yet another configuration example of the present embodiment will be described with reference to FIG. 7. In the examples of FIGS. 5A to 5D and FIG. 6, no specific description has been given of the sectional configuration and size of the atmospheric pressure plasma irradiating means 7 and the plasma discharging nozzle 31. The reaction space for generating atmospheric pressure plasma is usually small since it is difficult to generate plasma if large, and is also typically circular or rectangular in section. Thus, the atmospheric pressure plasma 8 discharged is also small. It is therefore difficult to plasma-clean the electrode layout surface 3 of a large semiconductor device 1 at a time, and the atmospheric pressure plasma irradiating means 28 or the plasma discharging nozzle 31 must be moved to sweep along the electrode layout surface 3, requiring time for plasma processing.

Figure 7:
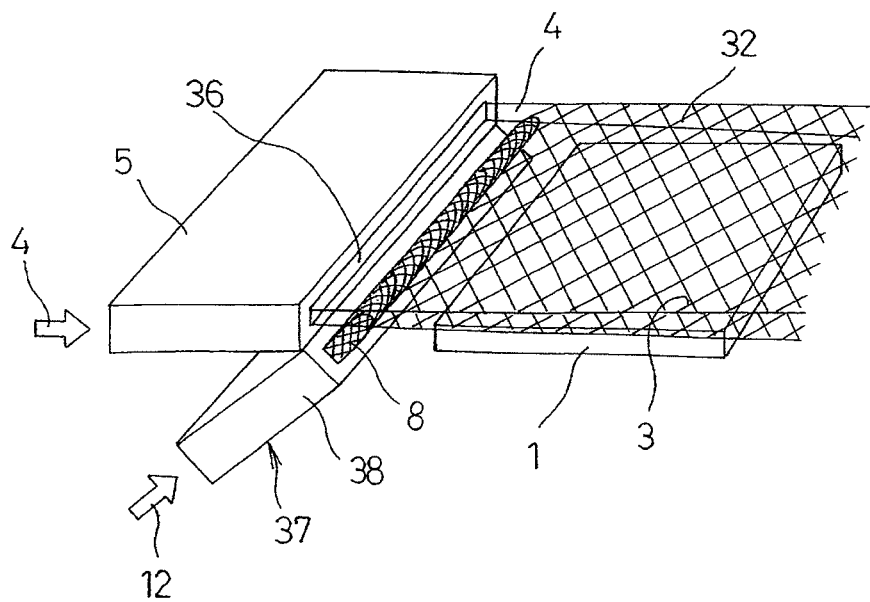
FIG. 7 is a perspective view of yet another configuration example of embodiment 2.

The configuration example of FIG. 7 is intended to solve this problem. A discharge port 36 of the gas delivery header 5 for discharging the first inert gas 4 is formed into a flat rectangular section having a width corresponding to the width dimension of the electrode layout surface 3 of the semiconductor device 1, and is configured so that the first inert gas 4 flows along the electrode layout surface 3 across the entire width. In addition to this, the atmospheric pressure plasma irradiating means 37 is configured so that its reaction container 38 also has a flat rectangular section having a width corresponding to the width dimension of the electrode layout surface 3 and is provided with a pair of flat electrodes (not shown) on opposite sides. A high frequency voltage is applied from a high frequency power supply (not shown) to between the pair of flat electrodes so that the interior of the flat reaction container 38 undergoes a high frequency electric field, and a mixed gas 12 of a second inert gas and a reaction gas is supplied from one end of this reaction container 38, whereby a flat and wide atmospheric pressure plasma 8 is discharged. Then, the atmospheric pressure plasma irradiating means 37 is arranged so that the atmospheric pressure plasma 8 discharged collides with the flow of the first inert gas 4 near the discharge port 36 of the first inert gas 4.

According to this configuration example, the atmospheric pressure plasma 8 discharged from the atmospheric pressure plasma discharging means 37 collides with the flow of the first inert gas 4 which flows along the electrode layout surface 3 from the discharge port 36 with a width corresponding to the entire width of the electrode layout surface 3, whereby radicals of the atmospheric pressure plasma 8 are carried by the first inert gas 4 flowing along the electrode layout surface 3. This makes it possible to develop the plasma 32 over the entire electrode layout surface 3 simultaneously and uniformly without fail, and plasma-clean all the electrode layout surface 3 at once in a short time effectively.

Embodiment 3

Figure 8:
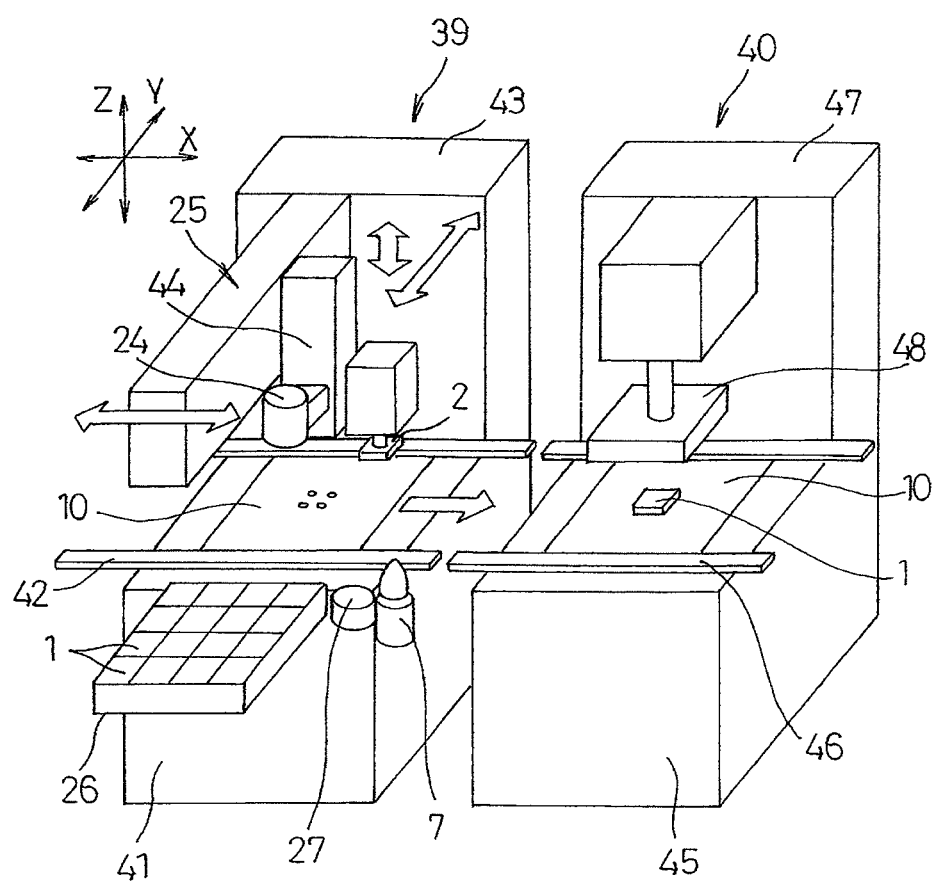
FIG. 8 is a perspective view showing a schematic configuration of embodiment 3 according to a part mounting apparatus to which the electrode bonding method of the present invention is applied.

Next, embodiment 3 according to a part mounting apparatus to which the electrode bonding method of the present invention is applied will be described with reference to FIGS. 8 and 9.

The part mounting apparatus according to the present embodiment is intended to practice the electrode bonding method of embodiment 1, and is composed of a part loading apparatus 39 and a full bonding apparatus 40 which are arranged in parallel. The part loading apparatus 39 has: substrate transporting means 42 which carries in, carries out, and positions a substrate and is arranged on the top of a base 41; part loading means 25 which is composed of a three-dimensional moving robot and is arranged on a support column 43 erected behind the base 41; and the suction head 2 which has the gas delivery header 5 and is arranged on a moving part 44 of the same. Second recognition means 24 is also arranged on the moving part 44. In addition to this, the part supply unit 26 is arranged in front of the base 41, and the first recognition means 27 and the atmospheric pressure plasma irradiating means 7 are arranged beside the same. Moreover, the full bonding apparatus 40 is configured to include: substrate transporting means 46 which carries in, carries out, and positions the substrate 10 and is arranged on the top of a base 45; and a thermocompression head 48 which is arranged on a support column 47 erected behind the base 45. The thermocompression head 48 heats and compresses the semiconductor device 1 loaded on the substrate 10 to fully bond their electrodes by thermocompression.

Figure 9:
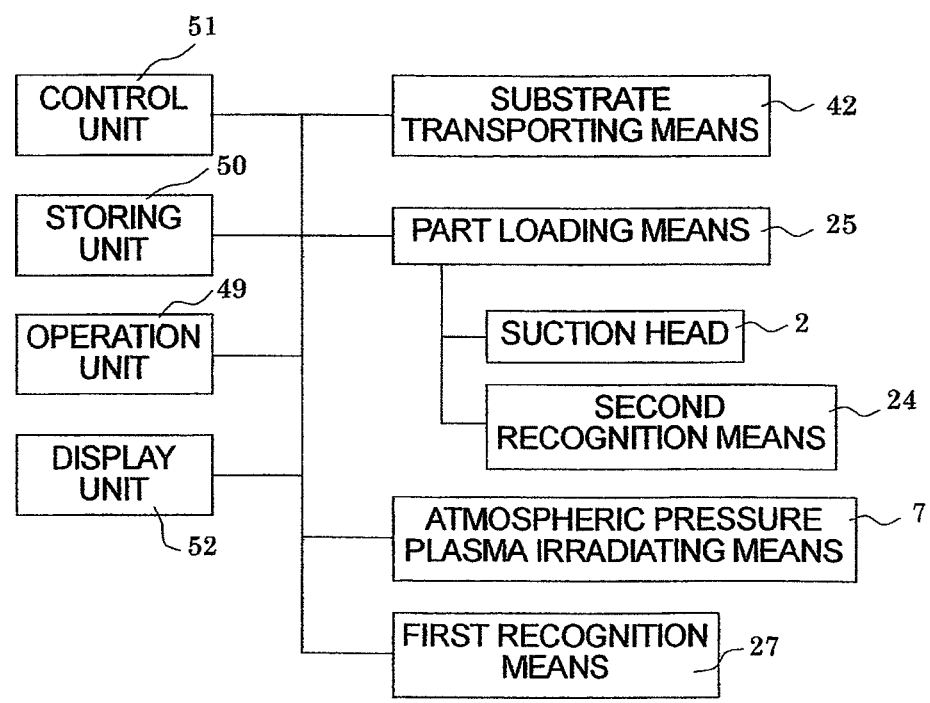
FIG. 9 is a block diagram showing the configuration of control of the part mounting apparatus according to embodiment 3.
Figure 10:
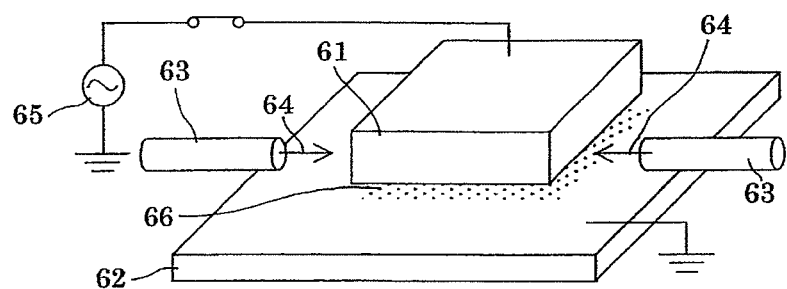
FIGS. 10A to 10C are process explanatory diagrams of a conventional electrode bonding method.
Figure 10:
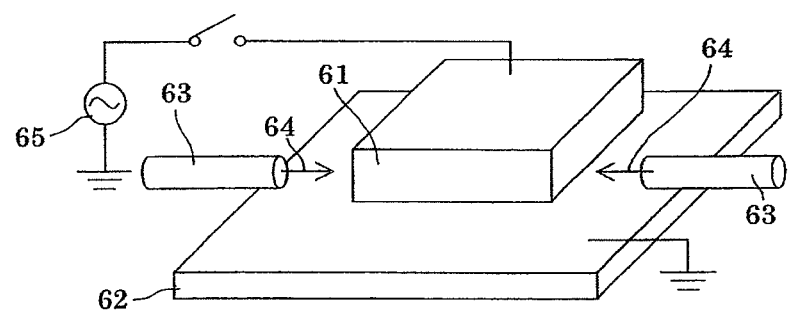
Figure 10:
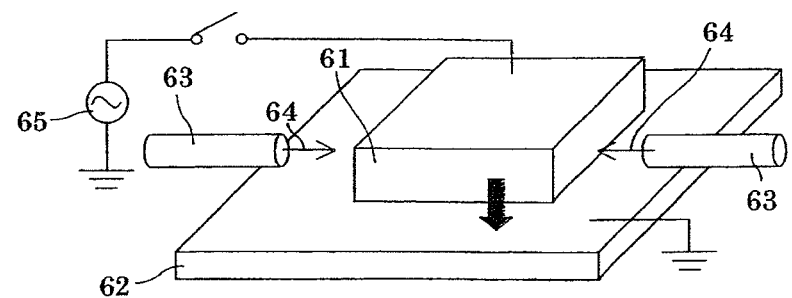
Figure 11:
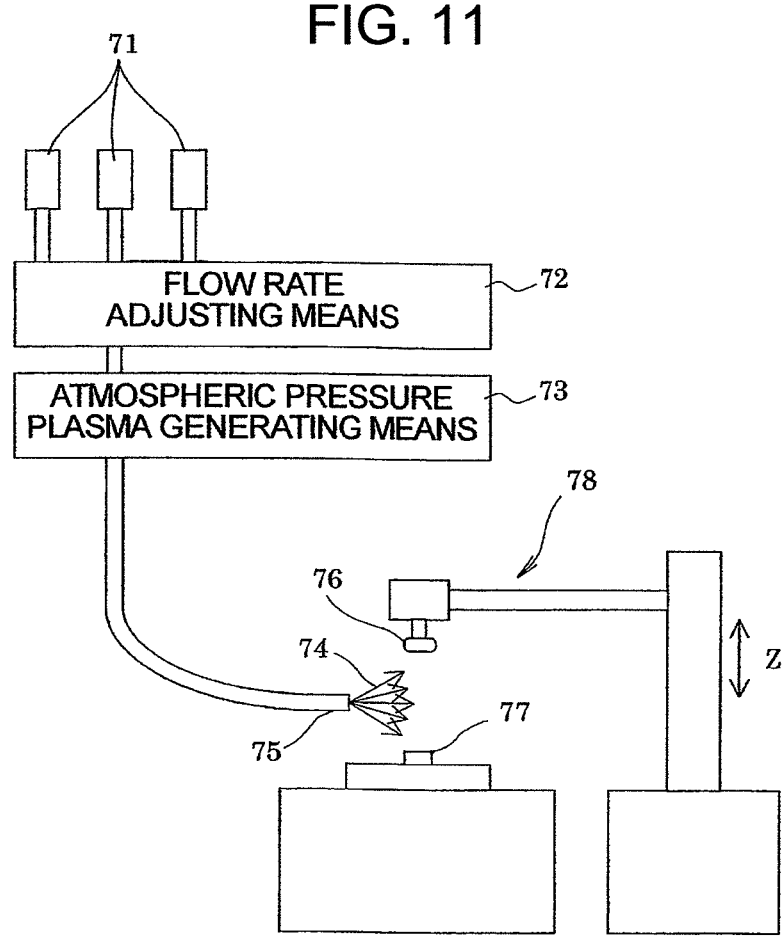
FIG. 11 is a schematic configuration diagram of an apparatus which exercises another conventional electrode bonding method.
Figure 12:
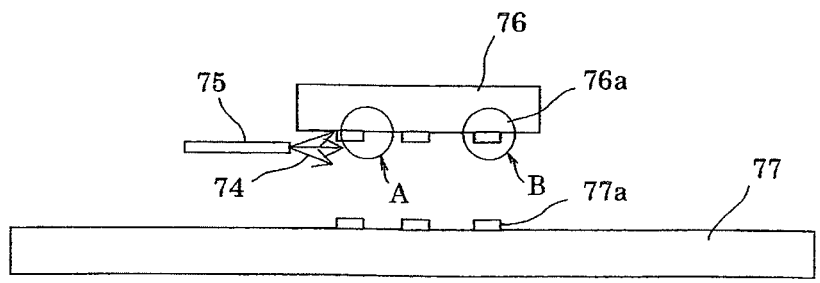
FIG. 12 is an explanatory diagram showing problems with the electrode bonding method shown in FIG. 11.

As shown in FIG. 9, the substrate transporting means 42, the part loading means 25 and its suction head 2, the second recognition means 24, the atmospheric pressure plasma irradiating means 7, and the first recognition means 27 of the part loading apparatus 39 are controlled in operation by a control unit 51 according to instructions from an operation unit 49 based on an operation program and various types of data stored in a storing unit 50. Moreover, the operation status, the results of various processes, and the like are displayed on a display unit 52.

Since the operation by which this part mounting apparatus mounts the semiconductor device 1 on the substrate 10 is the same as the mounting operation that has been described with reference to FIGS. 4A to 4F of embodiment 1, the description will be cited by reference and redundant description will be omitted.

The foregoing embodiments have dealt only with the case where the part to be mounted on the substrate 10 is the semiconductor device 1, whereas the part is not limited thereto. Various types of parts that have electrodes to be bonded to electrodes of a substrate, such as an IC component having a flexible substrate equipped with electrodes, are also applicable.

The foregoing embodiments have also dealt only with the case of cleaning the electrodes of the semiconductor device 1, the part, using the atmospheric pressure plasma 8. It should be appreciated, however, that the electrodes of the substrate 10 or both the electrodes of the part and the electrodes of the substrate 10 may be cleaned with the atmospheric pressure plasma 8. It should be noted that, the preferable configuration for cleaning the electrodes of the substrate 10 is such that: the gas delivery header 5 serving as inert gas supply means is arranged on the substrate transporting means 42 which serves as substrate positioning means; and the atmospheric pressure plasma irradiating means 28 is arranged on the part loading means 25.

The foregoing embodiments have also dealt only with the case of using the atmospheric pressure plasma 8 which is made of the mixed gas 12 of the second inert gas and the reactive gas, or generated by applying a high frequency electric field to the mixed gas. Nevertheless, it is also possible to use atmospheric pressure plasma that is generated by making a reactive gas or a mixed gas of a third inert gas and a reactive gas collide with atmospheric pressure plasma generated by applying a high frequency electric field to the second inert gas. In that case, it is possible to generate atmospheric pressure plasma with reliability and stability at low power, and make the reactive gas or the mixed gas collide with the atmospheric pressure plasma to generate radicals of the reactive gas efficiently in large amounts for irradiation. This allows efficient cleaning with low power.

INDUSTRIAL APPLICABILITY

As has been described, according to the present invention, electrode surfaces to be cleaned are irradiated with plasma so that the electrode surfaces are plasma-cleaned without the possibility of damaging parts to be bonded to a substrate. Moreover, the electrode surfaces cleaned continue being covered with the first inert gas even thereafter so that the cleaned state is maintained while bonding the electrodes to provide a bonding state of high reliability. This allows suitable application to part mounting apparatuses for mounting various types of parts on substrates.

The invention claimed is:

1. An electrode bonding method comprising:
    a plasma cleaning step of irradiating an electrode surface to be cleaned of at least either one of a part and a substrate with atmospheric pressure plasma for cleaning;
    an inert gas atmosphere maintaining step of covering the electrode surface to be cleaned and its vicinity with a first inert gas before the irradiation of the atmospheric pressure plasma is ended, and maintaining that state even thereafter;
    and a bonding step of bonding an electrode of the part and an electrode on the substrate before the inert gas atmosphere maintaining step is ended, wherein, in the plasma cleaning step, the electrode surface is cleaned by a second atmospheric pressure plasma generated by making a mixed gas of a third inert gas and a reactive gas collide with a first atmospheric pressure plasma generated by applying a high frequency electric field to a second inert gas.

2. The electrode bonding method according to claim 1, wherein, in the irradiating, ion charges are removed from the plasma by using a ground electrode arranged near the irradiating atmospheric pressure gas plasma, so that the irradiation primarily involves radicals alone.

3. The electrode bonding method according to claim 1, wherein, in the irradiating, the electrode surface to be cleaned and its vicinity are covered with the first inert gas before being irradiated with the atmospheric pressure gas plasma, so that the electrode surface to be cleaned is irradiated with radicals in the atmospheric pressure gas plasma through the medium of the first inert gas.

4. The electrode bonding method according to claim 1, wherein, in the covering, the first inert gas is supplied so as to flow along the electrode surface to be cleaned, and the first inert gas is sucked after it has flown along the electrode surface to be cleaned.

* * * * *